(12) United States Patent
Mintz et al.

(10) Patent No.: US 7,498,115 B2
(45) Date of Patent: Mar. 3, 2009

(54) PHOTORESIST COMPOSITIONS

(75) Inventors: Joan M. Mintz, Harvard, MA (US); Michael J. Kaufman, Holliston, MA (US); Norman S. Jessiman, Southborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 11/294,816

(22) Filed: Dec. 6, 2005

(65) Prior Publication Data

US 2006/0172225 A1    Aug. 3, 2006

Related U.S. Application Data

(60) Provisional application No. 60/633,923, filed on Dec. 6, 2004.

(51) Int. Cl.
  *G03C 1/492*    (2006.01)
  *G03C 1/494*    (2006.01)
  *G03C 1/76*    (2006.01)
(52) U.S. Cl. .................. 430/270.1; 430/269; 430/281.1
(58) Field of Classification Search .............. 430/270.1, 430/281.1, 269
See application file for complete search history.

(56) References Cited

U.S. PATENT DOCUMENTS

| | | | |
|---|---|---|---|
| 5,674,662 A | 10/1997 | Szmanda et al. | |
| 5,866,299 A * | 2/1999 | Szmanda et al. | 430/281.1 |
| 5,879,856 A * | 3/1999 | Thackeray et al. | 430/270.1 |
| 6,743,563 B2 * | 6/2004 | Cameron et al. | 430/270.1 |
| 6,767,687 B1 | 7/2004 | Kim et al. | |

FOREIGN PATENT DOCUMENTS

EP    0 561 625    9/1993

* cited by examiner

*Primary Examiner*—Geraldina Visconti
(74) *Attorney, Agent, or Firm*—Peter F. Corless; Darryl P. Frickey; Edwards Angell Palmer & Dodge, LLP

(57) ABSTRACT

Photoresists of the invention contain an added acid reaction component together with one or more resins and a photoactive component. Preferred photoresists of the invention can provide processes substrates such as microelectronic wafers with desired iso-dense bias values. Particularly preferred photoresists of the invention are chemically-amplified positive-acting resists and contain an ester-based solvent such as ethyl lactate or propylene glycol methyl ether acetate in addition to the acid reaction component.

6 Claims, No Drawings

PHOTORESIST COMPOSITIONS

BACKGROUND OF THE INVENTION

1. Field of the Invention

This invention relates to photoresist compositions that can exhibit enhanced properties, including optimized iso-dense bias of imaged lines. In particular, preferred resists of the invention contain an added acid reaction component which has been found can modulate desired iso-dense bias of imaged lines. Preferred resists of the invention contain an ester-based solvent such as ethyl lactate or propylene glycol methyl ether acetate in addition to the acid reaction component.

2. Background

Photoresists are photosensitive films for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define an image desired to be transferred to the underlying substrate. "Chemically amplified" photoresist compositions have been employed for higher performance applications. Such photoresists may be negative-acting or positive-acting and rely on multiple crosslinking events (in the case of a negative-acting resist) or deprotection reactions (in the case of a positive-acting resist) per unit of photogenerated acid. In other words, the photogenerated acid acts catalytically. See, for example, U.S. Pat. Nos. 6,680,159; 6,042,997; 5,075,199; 4,968,851; 4,883,740; 4,810,613; and 4,491,628.

Certain additives have been included in photoresist compositions to improve lithographic performance. See, for instance, U.S. Pat. Nos. 6,743,563; 6,727,049; 6,607,870; and 6,300,035.

For lithographic imaging of features having submicron dimensions, the iso-dense effects can become more prominent. The iso-dense effects result in a difference in transfer dimension for dense features as compared to features that are more spaced apart. A developed resist line or other feature is generally considered "isolated" herein if it is spaced from the closest adjacent resist feature a distance equal to three or more times the line width. Thus, e.g., if a line is printed at a 0.25 μm width, that line would be considered isolated (rather than dense) if the next adjacent resist feature was spaced at least about 0.75 microns from the line. Common resolution problems with isolated lines include rounded tops and undercutting.

Thus, it can be problematic to achieve desired transfer of images of both dense and isolated lines in the same imaged field. See, for instance, U.S. Pat. No. 6,667,136, which discusses that it can be difficult to make isolated and nested structures print as identically as desired resulting in an undesirable condition known as across chip line width variation.

It thus would be desirable to have new photoresist compositions. It would be particularly desirable to have new photoresist compositions that can enable control of iso-dense bias of imaged features.

SUMMARY OF THE INVENTION

We have now discovered new photoresist compositions that can provide desired iso-dense bias of imaged features.

Resists of the invention contain an added acid reaction component (sometimes referred to herein as an acid reaction product), suitably the reaction product of one or more organic acids optionally with one or more other reagents such as protected acids particularly esters. We have surprisingly found that addition of an acid reaction product to a resist formulation can modulate the iso-dense bias of resist to a desired value. See, for instance, the results set forth in the examples which follow.

As referred to herein, iso-dense line bias values are suitably determined as follows. Both isolated and dense lines are imaged through a photomask into a photoresist coating layer and the imaged lines are developed to provide a photoresist relief image. For analysis of iso-dense line bias both the isolated and dense resist have the same dimension (e.g. 200 microns, 250 microns, 300 microns, 400 microns, 500 microns, etc.) as defined in the photomask. To determine the iso-dense line bias, the measured line width of the dense line is subtracted from the measured line width of the dense line, i.e. iso-dense line bias=(measured developed isolated line width)−(measured developed dense line width). Widths of dense and isolated lines may be suitably measured with use of scanning electron micrographs (SEMs) of the developed lines.

Preferred added acids used to provide an additive of photoresists of the invention contain carboxylic acid moieties and are suitably relatively weak acids e.g. a pKa (in water at 25° C.) of zero or higher (more positive number), particularly a pKa of about 1, 2 or 3 or greater (i.e. even higher positive number). A pKa of from about 1 to 4 is particularly preferred. The acid also may have other substitution such as hydroxy, halo, cyano, alkoxy such as $C_{1-12}$alkoxy, and the like. The acid may suitably have from 1 to 20 carbon atoms, more typically 2 to about 12 carbons. Acids having from 2 to about 6 carbons are even more preferably. Specifically preferred reacted acids are lactic acid, acetic acid, propionic acid, and the like.

To provide an additive component (i.e. acid reaction product) of a photoresist of the invention, one or more acids or protected acids may be reacted together to provide a higher molecular species, e.g. a dimer, trimer or the like of one or more acids, or a protected form an acid such as an ester, acetal and the like. The reaction may be suitably may be conducted under acidic or basic conditions to effect the desired reaction and either neat or one or more inert solvents.

Particularly preferred resist additives are reaction products of lactic acid and ethyl lactate to form a higher molecular species including ethyl lactoyl lactate. Especially preferred are photoresists that contain such ethyl lactate/lactic acid reaction product additives and a solvent component that comprises ethyl lactate.

Also suitable are reaction products of acetic acid and propylene glycol methyl ether acetate (PGMEA) and acetic acid to form a higher molecular species. Especially preferred are photoresists that contain such PGMEA/acetic reaction product additives and a solvent component that comprises propylene glycol methyl ether acetate.

The term "reaction product" of an acid as referred to herein indicates that the compound has an acid (e.g. carboxy C(=O)O— moiety or masked acid group such as ester as a moiety of the compound or such moiety is present in a reacted form in the compound.

Preferred photoresists of the invention are positive chemically-amplified resists that contain one or more resins and a photoactive component such as one or more photoacid generator compounds. Particularly preferred resists also contain an added base such as an amine, particularly amine salts such as a salt of a tetraalkyl ammonium compound.

Especially preferred resists have a solvent component that comprises an ester-containing solvent such as ethyl lactate, propylene glycol methyl ether acetate (PGMEA), propylene glycol ethyl ether acetate, amyl acetate, or ethyl ether propionate (EEP). Ethyl lactate, amyl acetate and PGMEA are generally preferred. Preferred solvent components suitably contain a significant portion of an ester-based solvent, e.g. at least about 10, 15, 20, 25, 30 40 or 50 volume percent of the total solvent of the resist is one or more ester-based solvents, more preferably, at least about 60, 70, 80, 90 or 95 volume percent of the total solvents of a resist is one or more ester-based solvents such as ethyl lactate, amyl acetate or PGMEA.

Resists of the invention can be prepared by a variety of methods. In one protocol, the resist formulation is prepared and the acid reaction component is added to the formed resist. Alternatively, the acid also may be formulated together with all other resist components, i.e. the resin, photoacid generator, basic component and the acid reaction component may be added together to solvent carrier.

The invention also includes methods for modulating the iso-dense line bias of a particular to a desired value. Such methods of the invention generally include providing one or more acid reaction products in a photoresist composition in an amount sufficient to provide a desired iso-dense line bias. Amounts of one or more acid reaction products that will be sufficient to provide a desired iso-dense line bias value can be readily determined empirically. For example, different amounts of one or more acid reaction products may be added to samples of a photoresist composition and those resist samples can be simply tested for iso-dense line bias values. The photoresist sample with the desired thus measured iso-dense line bias then can serve as a standard formulation that will provide the desired iso-dense line bias.

Preferred methods for modulating iso-dense bias of a photoresist may including identifying a photoresist for providing a targeted iso-dense line basis value and providing an amount sufficient of one or more acid reaction products to provide a desired iso-dense line bias value. Such methods may further include imaging and developing a coating layer of the photoresist composition with added acid reaction product(s) and measuring the iso-dense line bias value of the developed photoresist layer. Such methods may still further comprise comparison of the measured iso-dense line bias value to a reference or desired iso-dense line bias value. Then, suitably, if a difference exists between the measured and reference iso-dense line bias values, the amount of the one or more added acid reaction products in the photoresist may be modulated (i.e. the amount of the one or more added acid reaction products may be increased or decreased in the photoresist) so that the measured iso-dense line bias value matches or at least substantially matches (e.g. within about 10% or 5% or less of a match to the reference value) of the reference iso-dense line basis value. In such methods, providing an amount sufficient of one or more acid reaction products includes an addition of one or more acid reaction products to a photoresist composition, rather than what would be provided by admixture of typical photoresist components of one or more resins, one or more photoacid generator compounds, solvent component, a basic additive and/or a surfactant.

In many preferred systems, the iso-dense bias of a photoresist will be a negative value. It has been found that addition or increase in amounts of an acid reaction product can result in an increase in the iso-dense bias value of a photoresist. In any event, however, the effect of any particular amount of an acid reaction product on the iso-dense line bias for any specific photoresist can be readily determined by simple testing of the photoresist.

The invention also provide methods for forming relief images of the photoresists of the invention, including methods for forming highly resolved patterned photoresist images (e.g. a patterned line having essentially vertical sidewalls) of sub-quarter micron dimensions or less, such as sub-0.2 or sub-0.1 micron dimensions. The invention includes photoresists that can be imaged at a wide range of wavelengths, including sub-300 nm and sub-200 nm, such as 248 nm, 193 nm and 157 nm. The invention also includes photoresists that can be imaged at higher wavelengths greater than 300 nm, such as 365 nm. Such photoresists may be positive-acting and include one or more novolac resins and a diazonaphthoquinone photoactive component.

The invention further provides articles of manufacture comprising substrates such as a microelectronic wafer or a flat panel display substrate having coated thereon the photoresists and relief images of the invention.

Other aspects of the invention are disclosed infra.

DETAILED DESCRIPTION OF THE INVENTION

As discussed above, we now provide new photoresist compositions that can provide desired iso-dense line bias values. Resists composition of the invention preferably contain one or more added acid reaction products, i.e. as discussed one or more acid reaction products which are material(s) that have been added to a photoresist composition, rather than what would be provided by admixture of typical photoresist components of one or more resins, one or more photoacid generator compounds, solvent component, a basic additive and/or a surfactant.

Resists of the invention preferably contain an added acid reaction component, preferably the reaction product of one or more organic acids, more preferably the reaction product of one or more organic acids that each has a pKa (as measured in water at 25° C.) of 0 or higher, particularly a pKa of from about 0.5 to 5.5, more preferably a pKa of from about 0.5 or 1 to about 3.5 or 4 or 4.5. Also preferred are reaction products of one or more organic carboxylic acids having a pKa of from about 1.5 or 2 to about 4 or 4.5.

Preferred acids to form a component of a photoresist of the invention have a molecular weight of at least about 100, more preferably at least about 120, 150, 200, 300, or 400, but also preferably less than about 500, 600, 700, 800, 900 or 1000.

The added acid reaction component may be suitably employed within a wide concentration range in a photoresist composition. Exemplary preferred amounts of the added acid component are set forth in the examples which follow.

Suitable amounts of the added acid reaction component include at least 0.01 weight percent of the added acid reaction component based on total solids (all components except solvent carrier) of a resist, more preferably at least about 0.02, 0.05, 0.1, 0.2, 0.5, 1, 3, 4 or 5 weight percent of the added acid reaction component based on total solids (all components except solvent carrier) of a resist. Generally preferred is use of the added acid reaction component in an amount of 0.02 to about 1 weight percent more preferably from about 0.02 to about 0.5 weight percent based on total solids of the resist.

Also preferred is use of the added acid reaction component in a weight excess relative to a basic additive (e.g. amine additive such as a tetraalkyl ammonium salt) of a resist, e.g. where the added acid reaction component is present in about a 2, 3, 4, 5, 6, 7, 8, 9, 10, 15, 20 or 30-fold weight excess relative to a basic additive component.

Further preferred is where the added acid reaction component is used in a weight amount that is less than the weight of the photoacid generator(s) used in the resist, e.g. the weight amount of the added reaction component in no more than about 10, 20, 30, 40, 50, 60, 70, or 80 weight percent of the total weight of the photoacid generator(s) present in the resist.

Exemplary suitable added acid reaction products include reaction products of carboxylic acids, particularly organic acids having 1 to 16 carbon atoms and from 0 to 3 carbon-carbon multiple bonds.

For instance, suitable added acid reaction products include reaction products of one or more of formic acid, optionally substituted acetic acid, optionally substituted propionic acid, optionally substituted butanionic acid, and optionally substituted lactic acid. Additional preferred added acid reaction products include reaction products of acetic acid substituted with groups such as cyano; fluoro including monofluoro, difluoro, and trifluoro; alkoxy including $C_{1-6}$alkoxy such as methoxy; hydroxy; and the like. Additional suitable added acid reaction products include reaction products of one or more of citric acid; crotonic acid; cyanomethyliminoacetic acid; gluconic acid; glyceric acid; glycolic acid; α-hydroxybutyric acid; β-hydroxybutyric acid maleic acid; malic acid; and the like.

Typically, the added acid reaction component is not photoactivated in order to provide acidic group(s). That is, in distinction from a photoacid generator compound (including a photoacid generator compound that may generate a carboxylic acid group upon exposure to activating radiation), the acid reaction product may comprises an acidic group such as a carboxylic acid moiety upon addition to a resist formulation, without any need for photoactivation to liberate the acidic moiety.

As discussed above, photoresists of the invention typically contain a resin component and a photoactive component. Photoresists of the invention preferably contain one or more resins that comprise one or more photoacid-acid labile moieties (e.g. ester or acetal groups) and one or more photoacid generator compounds (PAGs). The photoacid-labile moiety can undergo a deblocking reaction to provide a polar functional group such as hydroxyl or carboxylate. Preferably the resin component is used in a resist composition in an amount sufficient to render the resist developable with an aqueous alkaline solution.

Preferred PAGS can be photoactivated by exposure radiation having a wavelength of 248 nm, 193 nm or 157 nm.

Particularly preferred photoresists of the invention contain an imaging effective amount of one or more photoacid generator compounds and a resin suitable for imaging at 300 nm or less or 200 nm or less, such as a resin selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793, incorporated herein by reference; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997, incorporated herein by reference; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526, incorporated herein by reference.

2) phenolic resins used for imaging at greater than 300 nm such as 365 nm. Such resins include novolac resins which for positive-working systems are conveniently used in combination with a diazonapthoquinone photoactive component;

3) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664, incorporated herein by reference; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462, all incorporated herein by reference, and iii) polymers that contain polymerized anhydride units, particularly polymerized maleic anhydride and/or itaconic anhydride units, such as disclosed in European Published Application EP01008913A1 and U.S. Pat. No. 6,048,662, both incorporated herein by reference.

4) a resin that contains repeat units that contain a hetero atom, particularly oxygen and/or sulfur, and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914 and U.S. application Ser. No. 09/567,634.

5) a resin that contains fluorine substitution (fluoropolymer), e.g. as may be provided by polymerization of tetrafluoroethylene, a fluorinated aromatic group such as fluoro-styrene compound, and the like. Examples of such resins are disclosed e.g. in PCT/US99/21912.

For imaging at wavelengths greater than 200 nm, such as 248 nm, a particularly preferred chemically amplified photoresist of the invention comprises in admixture a photoactive component of the invention and a resin that comprises a copolymer containing both phenolic and non-phenolic units. For example, one preferred group of such copolymers has acid labile groups substantially, essentially or completely only on non-phenolic units of the copolymer, particularly alkylacrylate photoacid-labile groups, i.e. a phenolic-alkyl acrylate copolymer. One especially preferred copolymer binder has repeating units x and y of the following formula:

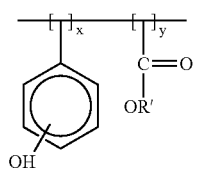

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a $M_w$ of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornyl or vinyl cyclohexanol compound, also may be used as a resin binder in compositions of the invention. Such copolymers also may be prepared by such free radical polymerization or other known procedures and suitably will have a $M_w$ of from about 8,000 to about 50,000, and a molecular weight distribution of about 3 or less.

The resist compositions of the invention also comprise a photoacid generator (i.e. "PAG") that is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

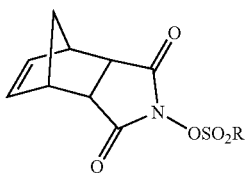

wherein R is camphor, adamantane, alkyl (e.g. $C_{1-12}$ alkyl) and perfluoroalkyl such as perfluoro($C_{1-12}$ alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs, particularly sulfonate salts. Two suitable agents for 193 nm and 248 nm imaging are the following PAGS 1 and 2:

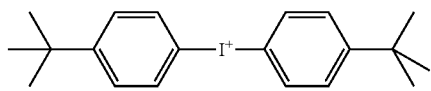

1

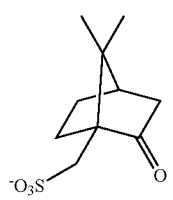

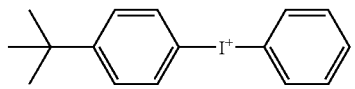

2

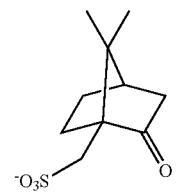

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3^-$ where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in the resists of the invention. Particularly for 193 nm imaging, generally preferred are PAGS that do not contain aromatic groups, such as the above-mentioned imidosulfonates, in order to provide enhanced transparency.

Preferred negative-acting compositions of the invention comprise a mixture of materials that will cure, crosslink or harden upon exposure to acid, and a photoactive component of the invention.

Particularly preferred negative acting compositions comprise a resin binder such as a phenolic resin, a crosslinker component and a photoactive component, particularly one or more photoacid generator compounds. Such compositions and the use thereof has been disclosed in European Patent Applications 0164248 and 0232972 and in U.S. Pat. No. 5,128,232 to Thackeray et al. Preferred phenolic resins for use as the resin binder component include novolaks and poly (vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycoluril resins are sold by American Cyanamid under trade names Cymel 1170, 1171, 1172, urea-based resins are sold under the trade names of Beetle 60, 65 and 80, and benzoguanamine resins are sold under the trade names Cymel 1123 and 1125.

Preferred negative-acting photoresists for imaging at 193 nm have been disclosed in 2003/0235785 to Barclay et al. Such negative-acting photoresists may include an acid reaction component as disclosed herein together with one or more photoacid generator compounds and one or more resins that contain repeat units that facilitate aqueous base solubility.

As stated above, various materials including disclosed acid reaction additive components may be optionally substituted. A "substituted" acid additive or other material may be suitably substituted at one or more available positions, typically 1, 2 or 3 available positions by groups such as hydroxy, halogen, $C_{1-6}$alkyl, $C_{1-6}$alkoxy, $C_{1-6}$alkylthio and the like.

Photoresists of the invention also may contain other materials. For example, other optional additives include actinic and contrast dyes, anti-striation agents, plasticizers, speed enhancers, sensitizers, etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

As discussed above, a preferred optional additive of resists of the invention is an added base, particularly tetrabutylammonium hydroxide (TBAH), or more particularly the lactate salt of tetrabutylammonium hydroxide, which can enhance resolution of a developed resist relief image. The added base is suitably used in relatively small amounts, e.g. about 1 to 10 percent by weight relative to the PAG, more typically 1 to about 5 weight percent. Other preferred basic additives include ammonium sulfonate salts such as piperidinium p-toluenesulfonate and dicyclohexylammonium p-toluenesulfonate; alkyl amines such as tripropylamine and dodecylamine; aryl amines such as diphenylamine, triphenylamine, aminophenol, 2-(4-aminophenyl)-2-(4-hydroxyphenyl)propane, etc.

As discussed above, the resin component of resists of the invention are typically used in an amount sufficient to render an exposed coating layer of the resist developable such as with an aqueous alkaline solution. More particularly, one or more resins of a photoresist composition of the invention will suitably comprise 50 to about 90 weight percent of total solids of the resist composition. The photoactive component should be present in an amount sufficient to enable generation of a latent image in a coating layer of the resist. More specifically, the photoactive component will suitably be present in an amount of from about 1 to 15 weight percent of total solids of a resist.

The photoresists of the invention are generally prepared following known procedures with the exception that an added acid is included in the formulation of such photoresists. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such as toluene or xylene; or a ketone such as methylethyl ketone, cyclohexanone and 2-heptanone. Typically the solids content of the photoresist varies between 5 and 35 percent by weight of the total weight of the photoresist composition.

The photoresists of the invention can be used in accordance with known procedures. Though the photoresists of the invention may be applied as a dry film, they are preferably applied on a substrate as a liquid coating composition, dried by heating to remove solvent preferably until the coating layer is tack free, exposed through a photomask to activating radiation, optionally post-exposure baked to create or enhance solubility differences between exposed and nonexposed regions of the resist coating layer, and then developed preferably with an aqueous alkaline developer to form a relief image.

The substrate on which a resist of the invention is applied and processed suitably can be any substrate used in processes involving photoresists such as a microelectronic wafer. For example, the substrate can be a silicon, silicon dioxide or aluminum-aluminum oxide microelectronic wafer. Gallium arsenide, ceramic, quartz, glass or copper substrates may also be employed. Substrates used for liquid crystal display and other flat panel display applications are also suitably employed, e.g. glass substrates, indium tin oxide coated substrates and the like.

A liquid coating resist composition may be applied by any standard means such as spinning, dipping or roller coating. Photoresists of the invention also may be formulated and applied as dry film resists, particularly for printed circuit board manufacture applications. The exposure energy should be sufficient to effectively activate the photoactive component of the radiation sensitive system to produce a patterned image in the resist coating layer. Suitable exposure energies typically range from about 1 to 300 mJ/cm$^2$. As discussed above, preferred exposure wavelengths include sub-300 nm such as 248 nm, and sub-200 nm such as 193 nm and 157 nm. Suitable post-exposure bake temperatures are from about 50° C. or greater, more specifically from about 50 to 140° C. For an acid-hardening negative-acting resist, a post-development bake may be employed if desired at temperatures of from about 100 to 150° C. for several minutes or longer to further cure the relief image formed upon development. After development and any post-development cure, the substrate surface bared by development may then be selectively processed, for example chemically etching or plating substrate areas bared of photoresist in accordance with procedures known in the art. Suitable etchants include a hydrofluoric acid etching solution and a plasma gas etch such as an oxygen plasma etch.

All documents mentioned herein are incorporated herein by reference. The following non-limiting examples are illustrative of the invention.

EXAMPLE 1

Preparation of an Acid Reaction Component

Approximately 75 g of IRN 77 ion-exchange resin was added to 1000 g of ethyl lactate. The mixture was held at room temperature for 5 days. The presence of ethyl lactoyl lactate (i.e. "ELL") was confirmed analytically and the ion-exchange resin was removed from the ethyl lactate by filtration. This solution is referred to as additive solution 1.

EXAMPLE 2

Preparation of Photoresist Samples Containing Additive Solution 1

Two photoresist samples, Resist 1 and 2 were prepared by mixing a resin consisting of a terpolymer of p-hyrdroxystyrene, styrene, and t-butylmethacrylate, a photoacid generator of di-(4-t-butylphenyl)iodonium-2-trifluoromethylbenzenesulfonate, a basic component of tetramethyl ammonium lactate, a surfactant of ammonium perfluoroalkyl sulfonate, a surfactant of a fluorinated acrylic copolymer, formulated as 14.4 percent solids (all components except solvent) in a solvent of ethyl lactate. An acid reaction product solution (additive solution 1 as described in above Example 1) was added to one of the samples, referred to as Resist 2.

The resist samples were used to image 150 nm isolated lines and 150 nm densely spaced lines. The increase in ELL (i.e. ethyl lactoyl lactate) content dramatically changed the iso-dense bias of Resist 2 when compared to Resist 1.

| Sample | ELL content | Width of isolated line | Width of dense line | Iso – dense bias |
|---|---|---|---|---|
| Resist 1 | 1682 ppm | 153.4 nm | 161.3 nm | −7.9 nm |
| Resist 2 | 5292 ppm | 159.2 nm | 235.9 nm | −76.7 nm |

EXAMPLE 3

Preparation of an Acid Reaction Component 1944 grams of ethyl lactate were added to a reaction vessel and cooled to 5° C. Agitation was started in the vessel, and 28 grams of a 25 wt % solution of tetramethyl ammonium hydroxide were added to the reaction vessel over one hour. 28.025 grams of a 90 wt % solution of lactic acid were added to the reaction vessel. After 5 hours the solution was removed from the vessel and stored at −10° C. until used as a photoresist additive. The presence of 6.7 wt % of ELL was confirmed analytically. This solution is referred to as additive solution 2.

EXAMPLE 4

Preparation of an Acid Reaction Component 116.6 kg of ethyl lactate were added to a reaction vessel. Agitation was started in the vessel, and 1.677 kg of a 25 wt % solution of tetramethyl ammonium hydroxide and 1.681 kg of a 90 wt % solution of lactic acid were added to the reaction vessel. After 2 hours the solution was removed from the vessel and stored at −1 to 10° C. until used as a photoresist additive. The presence of 3.8 wt % of ELL was confirmed analytically. This solution is referred to as additive solution 3.

EXAMPLE 5

Preparation of an Acid Reaction Component 272.1 kg of ethyl lactate were added to a reaction vessel. Agitation was started in the vessel, and 3.91 kg of a 25 wt % solution of tetramethyl ammonium hydroxide and 3.95 kg of a 90 wt % solution of lactic acid were added to the reaction vessel. After 1 hour the solution was removed from the vessel and stored at −1 to 10° C. until used as a photoresist additive. The presence of 2.7 wt % of ELL was confirmed analytically. This solution is referred to as additive solution 4.

EXAMPLE 6

Preparation of an Acid Reaction Component 560 grams of a 25 wt % solution of tetramethyl ammonium hydroxide were added to a reaction vessel and cooled to 8° C. 153.679 grams of a 90 wt % solution of lactic acid was slowly added to the reaction vessel over several hours. This solution is referred to as the TMAH/LA solution. 2000 grams of ethyl lactate were added to another reaction vessel and cooled to 10° C. Agitation was started in the vessel, and 35.681 grams of the TMAH/LA solution produced above was added to the reaction vessel. An additional 20.343 g of 90 wt % lactic acid was added to the reaction vessel. After 5 hours the solution was removed from the vessel and stored at −10° C. until used as a photoresist additive. The presence of 0.010 wt % of ELL was determined analytically. This solution is referred to as additive solution 5.

EXAMPLE 7

Preparation of Photoresist Containing Additive Solutions 2, 3, 4 and 5

Four photoresist samples (Resist 3, 4, 5, and 6) were prepared by mixing a resin consisting of a terpolymer of p-hyrdroxystyrene, styrene, and t-butylmethacrylate, a photoacid generator of Di-(4-t-butylphenyl)iodonium-2-trifluoromethylbenzenesulfonate, a surfactant of a fluorinated acrylic copolymer, formulated as 12.9 percent solids (all components except solvent) in a solvent of ethyl lactate. Four additive solutions (additive solutions 2, 3, 4 and 5 from Example 3 through 6 respectively) containing ELL in different concentrations were formed as described above by changing the order of addition of tetramethyl ammonium lactate, lactic and ethyl lactate to the reaction vessel and the reaction temperature. The additive solutions were added to resist samples 3, 4, 5 and 6. The resist samples were used to image 180 nm isolated lines and 180 nm lines with 280 nm space between the lines.

| Sample | ELL content (ppm) | Width of isolated line (nm) | Width of dense line (nm) | Iso – dense bias (nm) |
|---|---|---|---|---|
| Resist 3 | 30 | 181 | 178 | 3 |
| Resist 4 | 729 | 182 | 178 | 4 |
| Resist 5 | 1148 | 185 | 179 | 6 |
| Resist 6 | 1360 | 182 | 173 | 9 |

EXAMPLE 8

A series of photoresist batches were manufactured by mixing a resin consisting of a terpolymer of p-hyrdroxystyrene, styrene, and t-butylmethacrylate, a photoacid generator of Di-(4-t-butylphenyl)iodonium-2-trifluoromethylbenzenesulfonate, a basic component of tetramethyl ammonium lactate, a surfactant of ammonium perfluoroalkyl sulfonate, a surfactant of a fluorinated acrylic copolymer, formulated as 11.9 percent solids (all components except solvent) in a solvent of ethyl lactate. Several different solutions of tetramethyl ammonium lactate and ethyl lactate, each containing varying amounts of ELL were used to prepare these batches. As a result there was variation in the ELL content between the resist samples.

The iso-dense bias was measured using the same technique as in Example 1.

| Sample | ELL content (ppm) | Iso – dense bias |
|---|---|---|
| Resist 7 | 2316 | 13 |
| Resist 8 | 2022 | 12.5 |
| Resist 9 | 1634 | 4.8 |
| Resist 10 | 2087 | 5.4 |
| Resist 11 | 1896 | 7.5 |
| Resist 12 | 1285 | 3.5 |
| Resist 13 | 1115 | 5.4 |
| Resist 14 | 2213 | 11 |

The foregoing description of the invention is merely illustrative thereof, and it is understood that variations and modifications can be effected without departing from the spirit or scope of the invention as set forth in the following claims.

What is claimed is:

1. A photoresist composition comprising:
   i) one or more resins;
   ii) one or more photoacid generator compounds; and
   iii) wherein the ethyl lactoyl lactate is present in an amount of at least 0.05 weight percent base don total solids of the photoresist composition.

2. The photoresist of claim 1 wherein the photoresist comprises a solvent component that comprises ethyl lactate.

3. A method of forming a photoresist relief image comprising:
   (a) applying a coating layer of a photoresist composition of claim 1 on a substrate;
   (b) exposing the photoresist coating layer to patterned activating radiation and developing the exposed photoresist layer to provide a relief image.

4. An article of manufacture having on at least one surface a coating layer of the photoresist composition of claim 1.

5. The photoresist of claim 1 wherein the photoresist comprises a solvent component that comprises propylene glycol methyl ether acetate.

6. A method of forming a photoresist relief image comprising steps of:
   (a) admixing components comprising ethyl lactoyl lactate, a solvent component, one or more resins, and one or more photoacid generator compounds to provide a photoresist composition, and wherein ethyl lactoyl lactate is added to an admixture comprising a solvent component
   (b) after said admixing components of step (a), adding ethyl lactoyl lactate to the admixture comprising a solvent component;
   (c) after adding ethyl lactoyl lactate to the photoresist composition in step (b), applying a coating layer of the photoresist composition on a substrate;
   (d) exposing the photoresist coating layer to patterned activating radiation and developing the exposed photoresist layer to provide a relief image.

* * * * *